United States Patent [19]
Kudo

[11] Patent Number: 4,892,837
[45] Date of Patent: Jan. 9, 1990

[54] METHOD FOR MANUFACTURING SEMICONDUCTOR INTEGRATED CIRCUIT DEVICE

[75] Inventor: Satoshi Kudo, Maebashi, Japan
[73] Assignee: Hitachi, Ltd., Tokyo, Japan
[21] Appl. No.: 279,032
[22] Filed: Dec. 2, 1988

[30] Foreign Application Priority Data

Dec. 4, 1987 [JP] Japan .................................. 62-308446
Jan. 18, 1988 [JP] Japan .................................... 63-8134

[51] Int. Cl.[4] ........................................... H01L 21/265
[52] U.S. Cl. ........................................ 437/31; 437/33; 437/228; 437/233; 148/DIG. 11; 357/59
[58] Field of Search ..................... 437/31, 32, 33, 228, 437/233; 357/34, 35, 59 H; 148/DIG. 10, DIG. 11

[56] References Cited
PUBLICATIONS
IBM TDB, vol. 28, No. 5, 10/85, pp. 2196-2198.
IBM TDB, vol. 29, No. 5, 10/86, pp. 2262-2264.

Primary Examiner—Brian E. Hearn
Assistant Examiner—Kevin McAndrews
Attorney, Agent, or Firm—Antonelli, Terry & Wands

[57] ABSTRACT

Disclosed is a method of producing a bipolar transistor which enables an external base region, an intrinsic base region and an emitter region to be formed in self-alignment with respect to the base electrode. More specifically, the method comprises the steps of side-etching an insulating film formed underneath the base electrode by a wet etching process to provide an undercut portion, depositing polycrystalline silicon so as to extend into the undercut portion by low pressure CVD to thereby fill the undercut portion with the polycrystalline silicon, and subjecting the polycrystalline silicon to thermal oxidation, thereby simultaneously forming a sidewall spacer whereby the base electrode and the emitter electrode are electrically isolated from each other and an oxide film on the emitter forming region, the oxide film having high selectivity in anisotropic etching with respect to the substrate (silicon).

22 Claims, 8 Drawing Sheets

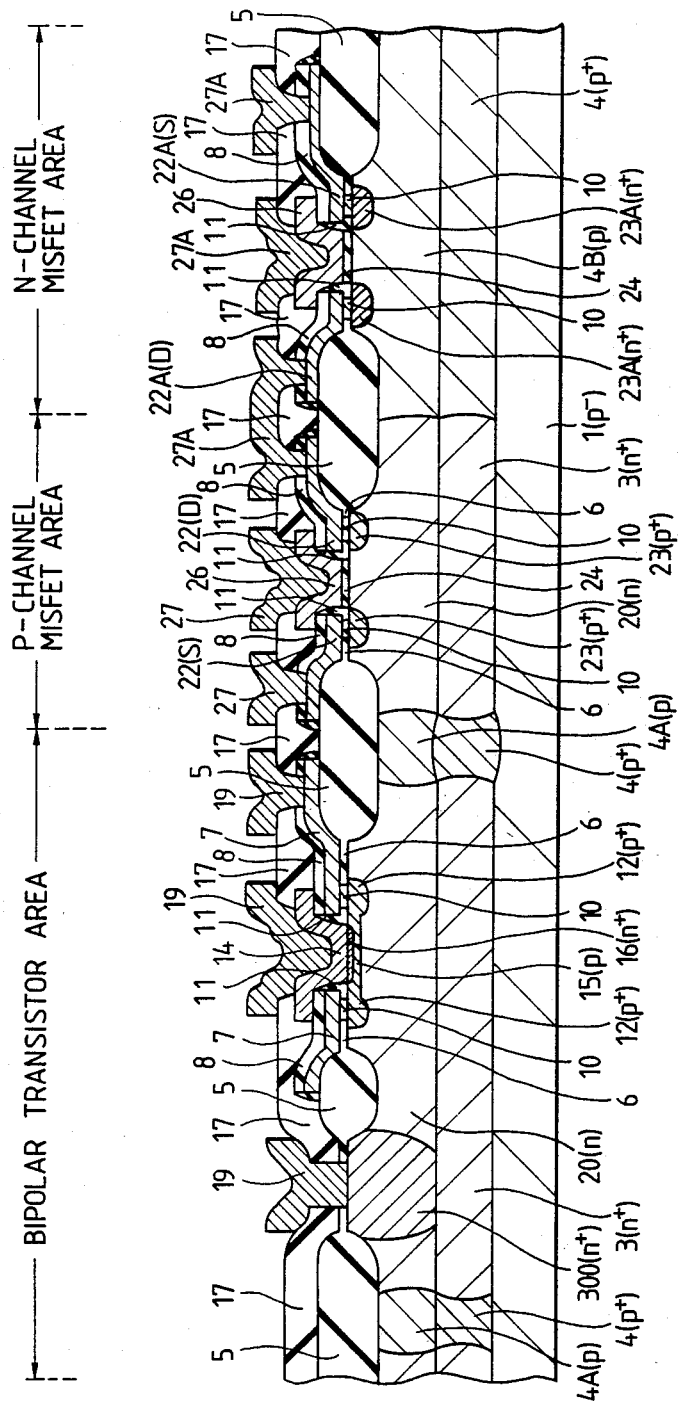

METHOD FOR MANUFACTURING SEMICONDUCTOR INTEGRATED CIRCUIT DEVICE

BACKGROUND OF THE INVENTION

1. Technical Field of the Invention

The present invention relates to a semiconductor integrated circuit device and, more particularly, to a technique which may be effectively applied to a semiconductor integrated circuit device having a bipolar transistor or/and a MISFET.

2. Prior Art

A technique which is most suitable for achieving high integration and high-speed operation of bipolar transistors is disclosed in "NIKKEI MICRODEVICES", NIKKEI McGrow Hill, November 1985, pp. 73-74. The following is a summary of the bipolar transistor producing method described in the above-mentioned literature.

First, a silicon nitride film is formed on a principal surface of an n-type epitaxial layer within a bipolar transistor forming region which is defined by an insulating film for isolation.

Next, a polycrystalline silicon film is formed on the silicon nitride film. Thereafter, the polycrystalline silicon film is patterned so that a region for forming an active-base region and an emitter region is opened, thus forming a base electrode.

Next, boron(B), which is a p-type impurity, is introduced into the base electrode. Thereafter, the surface of the base electrode is oxidized to form a silicon oxide film using as an oxidation-resistant mask the silicon nitride film which is exposed through the region for forming an active-base region and an emitter region.

Next, with the silicon oxide film on the surface of the base electrode used as an etching-resistant mask, the silicon nitride film on the region for forming an active-base region and an emitter region is removed by etching, and the silicon nitride film underneath the end portion of the base electrode on the side thereof which is closer to the removed region is removed by side-etching to form an undercut portion.

Next, a polycrystalline silicon film is deposited on the whole surface of the substrate in such a manner that the undercut portion is filled with the polycrystalline silicon film. Thereafter, the polycrystalline silicon film deposited on the flat portions except for that part of the silicon film which is buried in the undercut portion is removed by an anisotropic etching process such as reactive ion etching (hereinafter referred to as "RIE") to expose the surface of the epitaxial layer within the region for forming an active-baser region and an emitter region.

Next, thermal oxidation is carried out to form a silicon oxide film on a part of the polycrystalline silicon film buried in the undercut portion and on the exposed surface of the epitaxial layer.

Next, a p-type impurity is introduced into the principal surface region of the epitaxial layer within the region which is defined by the base electrode to form a p-type active-base region. An external base region is formed by diffusion of the p-type impurity in the base electrode into the principal surface region of the epitaxial layer through the polycrystalline silicon film buried in the undercut portion. The active-base region is connected to the external base region.

Next, a silicon oxide film and a polycrystalline silicon film are successively deposited on the whole surface of the substrate and then these films are removed by an anisotropic etching process such as RIE to form an emitter opening within the region defined by the base electrode.

Next, a polycrystalline silicon film is formed in such a manner as to connect with the active-base region through the emitter opening. This polycrystalline silicon film is then subjected to predetermined patterning to form an emitter electrode. An n-type impurity is introduced into the emitter electrode and then diffused into the active-based region to form an n-type emitter region.

In the bipolar transistor fabricated in this way, the external base region, active-base region, emitter region and emitter electrode can be formed in self-alignment with respect to the base electrode and it is therefore possible to achieve high integration. Further, since a region into which the p-type impurity in the base region is diffused is determined by both the amount in which the silicon nitride film underneath the base electrode is removed by side-etching to form the undercut portion and the amount in which a part of the polycrystalline silicon film buried in the undercut portion is oxidized, it is possible to form a smaller external base region than in the case where the bipolar transistor is formed by photolithography technique and it is therefore possible to achieve high integration.

SUMMARY OF THE INVENTION

Summary of First Invention

The present inventors conducted studies of the above-described method for producing a bipolar transistor and, as a result, have found that the prior art suffers from the following problems.

In the bipolar transistor according to the prior art, after a polycrystalline silicon film has been buried in the undercut portion at the end portion of the base electrode, the polycrystalline silicon film formed on the region for forming an active-base region and an emitter region is removed by an anisotropic etching process such as RIE. In this anisotropic etching process, the selectivity of the polycrystalline silicon film with respect to the epitaxial layer defined by a single crystal silicon layer is small. In other words, the etch rate of the polycrystalline silicon film buried in the undercut portion by RIE is substantially the same as that of the single crystal silicon layer (epitaxial layer) within the region where an active base and an emitter are to be formed. For this reason, the surface of the epitaxial layer in the region for forming an active-base region and an emitter region is over-etched to a substantial extent and therefore the surface of the epitaxial layer is markedly roughed or damaged. As a result, crystal defects and dislocation are generated in the surface of the epitaxial layer, which results in breakdown of the emitter-base junction and occurrence of a carrier trap phenomenon. For such reasons, the cut-off frequency ($f_T$) and current-amplification factor ($h_{FE}$) of the bipolar transistor are likely to lower or vary. These problems lead to deterioration of the electrical characteristics of the bipolar transistor.

It is an object of the present invention to provide a technique which enables achievement of high integration and high-speed operation of a semiconductor integrated circuit device having a bipolar transistor and also permits an improvement in the electrical characteristics thereof.

It is another object of the present invention to provide a technique which enables attainment of the above-described object by reducing roughing or damage of the surface of the emitter region of the bipolar transistor.

The above and other objects and novel features and advantages of the first invention will become more apparent from the following description taken in conjunction with the accompanying drawings.

The following is a brief summary of the first invention among those disclosed in the present application.

A semiconductor integrated circuit device having a bipolar transistor is manufactured by a method which comprises the steps of: successively depositing a first insulating film-, a base electrode forming layer including as a principal constituent a silicon film containing an impurity of a predetermined conductivity type and a second insulating film on a principal surface of a silicon substrate; patterning both the second insulating film and the base electrode forming layer by an anisotropic etching process to form a base electrode; side-etching the first insulating film underneath the end portion of the base electrode on the side thereof which is closer to an emitter electrode forming region by an isotropic etching process to form an undercut portion; depositing a silicon film on the whole surface of the substrate in such a manner that the undercut portion is filled with the silicon film; subjecting the silicon film to thermal oxidation except for that part of the silicon film which is buried in the undercut portion to form a third insulating film; removing the third insulating film from the emitter electrode forming region by etching to expose the surface of the silicon substrate; introducing a predetermined impurity into the surface region of the silicon substrate using as masks the second insulating film formed on the base electrode and the third insulating film formed on the sidewall portion thereof to form an intrinsic base region; and forming an emitter electrode on the exposed surface of the silicon substrate.

Further, a predetermined impurity is introduced into the substrate through the emitter electrode to form an emitter region.

Simultaneously with the step of subjecting the silicon film to thermal oxidation except for that part of the silicon film which is buried in the undercut portion to form the third insulating film, an impurity which has been introduced into the base electrode in advance is diffused into the principal surface region of the silicon substrate through the silicon film buried in the undercut portion to form an external base region.

By virtue of the above-described means, when the base electrode forming layer is subjected to an anisotropic etching process (RIE) to form a base electrode, the surface of the silicon substrate within the emitter electrode forming region is covered with the first insulating film underlying the base electrode forming layer and it is therefore possible to reduce roughing or damage of the surface of the silicon substrate. Further, after the silicon film has been formed into the third insulating film except for that part of the silicon film which is buried in the undercut portion, that part of the third insulating film which is within the emitter electrode forming region is removed by etching. Therefore, it is possible to increase the ratio of etch rates between the third insulating film and the silicon substrate and hence possible to reduce roughing or damage of the surface of the silicon substrate within the emitter electrode forming region.

Since the size of a region into which the impurity in the base electrode is diffused can be determined by the amount of side etching of the first insulating film and the amount in which the third insulating film is formed (i.e., the thermal oxidation time), it is possible to reduce the size of the external ( or, graft ) base region and achieve high integration.

Since the intrinsic base region, external base region, emitter region and emitter electrode can be formed in self-alignment with respect to the base electrode, it is possible to reduce the occupied area of the bipolar transistor and achieve high integration.

Further, since the size of the external base region can be reduced, it is possible to reduce the pn junction capacitance between the external base region and the collector region and hence achieve high operating speed.

Summary of Second Invention

On the other hand, the present inventors conducted studies in order to form a MISFET by applying a bipolar transistor producing method according to the prior art. Application of the conventional method of producing a bipolar transistor and the structure thereof to a method of producing a MISFET and the structure thereof is advantageous in terms of the following points.

First, when a bipolar transistor and a MISFET are formed on the same semiconductor substrate, it is possible to reduce the number of steps in the manufacturing process and hence the lower the production cost.

Secondly, the source and drain diffusion layers of a MISFET can be formed in self-alignment with respect to source and drain electrodes which are formed thereabove and electrically connected thereto.

Accordingly, it is unnecessary to increase the size of the source and drain regions with an allowance made for mask alignment in contrast to conventional MISFET forming techniques (e.g., a technique whereby, after source and drain diffusion layers have been formed, contact holes are formed by mask alignment and source and drain electrodes made of Al are formed through the contact holes). Thus, it is possible to reduce the junction capacitance (PN junction capacitance) between the source and drain regions and the semiconductor substrate and therefore possible to achieve a high-speed MISFET.

With a view to obtaining the first and second advantages described above, the present inventors thought of applying the bipolar transistor producing method and the bipolar transistor structure to a method of producing a MISFET and the structure thereof. The present inventors have, however, found that the application of the prior art method and structure involves the following problems.

In the bipolar transistor according to the prior art, after a polycrystalline silicon film has been buried in the undercut portion at the end portion of the base electrode, the polycrystalline silicon film formed on the region for forming an active-base region and an emitter region is removed by an anisotropic etching process such as RIE. In this anisotropic etching process, the selectivity of the polycrystalline silicon film with respect to the epitaxial layer is small. In other words, the etch rate of the polycrystalline silicon film buried in the undercut portion by RIE is substantially the same as that of the single crystal silicon layer (epitaxial layer)

within the region where an active base and an emitter are to be formed. For this reason, the surface of the epitaxial layer in the region for forming an active-base region and an emitter region is over-etched to a substantial extent and therefore the surface of the epitaxial layer is markedly roughed or damaged. As a result, crystal defects and dislocation are generated in the surface of the epitaxial layer, which leads to deterioration of the electrical characteristics of the bipolar transistor. More specifically, mere application of the above-described prior art to the formation of a MISFET similarly causes roughing or damage of the surface of the substrate in the gate electrode forming region within the region (channel region) which is defined by the source and drain electrodes corresponding to the base electrode, which leads to deterioration of the electrical characteristics of the MISFET, for example, variations in the threshold voltage $V_{th}$.

It is an object of the present invention to provide a technique which enables achievement of high integration and high-speed operation of a semiconductor integrated circuit device having a MISFET and also permits an improvement in the electrical characteristics thereof.

It is another object of the present invention to provide a technique which enables attainment of the above-described object by reducing roughing or damage of the surface of the substrate within the gate electrode forming region of the MISFET.

The above and other objects and novel features and advantages of the second invention will become more apparent from the following description taken in conjunction with the accompanying drawings.

The following is a brief summary of the second invention among those disclosed in the present application.

A semiconductor integrated circuit device having a MISFET is manufactured by a method which comprises the steps of: successively depositing on a principal surface of a silicon substrate a first insulating film, an electrode forming layer including as a principal constituent a silicon film of a conductivity type which is opposite to that of the silicon substrate and a second insulating film; patterning both the second insulating film and the electrode forming layer by an anisotropic etching process to form source and drain electrodes which are spaced apart from each other at a predetermined spacing; side-etching the first insulating film underneath the respective end portions of the source and drain electrodes which face each other by an isotropic etching process to form undercut portions; depositing a silicon film on the whole surface of the substrate in such a manner that the undercut portions are filled with the silicon film; subjecting the silicon film to thermal oxidation except for that part of the silicon film which is buried in the undercut portions to form a third insulating film; removing that part of the third insulating film which extends between the source and drain electrodes to expose the surface of the silicon substrate; and forming a gate electrode on the exposed surface of the silicon substrate with a gate insulating film (a fourth insulating film) interposed therebetween. In addition, in the step of forming the third insulating film or a step carried out thereafter, the impurities which are introduced in the source and drain electrodes are diffused into the principal surface region of the silicon substrate through the silicon films buried in the undercut portions to form source and drain regions, respectively.

By virtue of the above-described means, when the electrode forming layer is subjected to an anisotropic etching process (RIE) to form source and drain electrodes, the surface of the silicon substrate within the gate insulating film forming region is covered with the first insulating film underlying the electrode forming layer and it is therefore possible to reduce roughing or damage of the surface of the silicon substrate. Further, after the silicon film has been formed into the third insulating film except for that part of the silicon film which is buried in each undercut portion by thermal oxidation, that part of the third insulating film which is within the gate electrode forming region is removed by etching. Therefore, it is possible to increase the ratio of etch rates between the thrid insulating film and the silicon substrate and hence possible to reduce roughing or damage of the surface of the silicon substrate within the gate insulating film forming region.

Since the sizes of regions into which the impurities in the source and drain electrodes are diffused to form source and drain regions, respectively, can be determined by the amount of side etching (i.e., the amount of undercutting) of the first insulating film and the amount in which the third insulating film is formed (i.e., the amount of thermal oxidation of the silicon film), it is possible to reduce the respective sizes of the source and drain regions and achieve high integration.

Since the pn junction capacitance between each of the source and drain regions and the silicon substrate can be reduced, it is possible to achieve high operating speed.

Further, since the source and drain regions and the gate electrode can be formed in selfalignment with respect to the source and drain electrodes, it is possible to increase the integration density.

BRIEF DESCRIPTION OF THE DRAWINGS

FIG. 19 is a fragmentary sectional view of a Bi-CMOS device according to a modification which is formed by combining together the first and second inventions;

DESCRIPTION OF THE PREFERRED EMBODIMENTS

Figure 1:
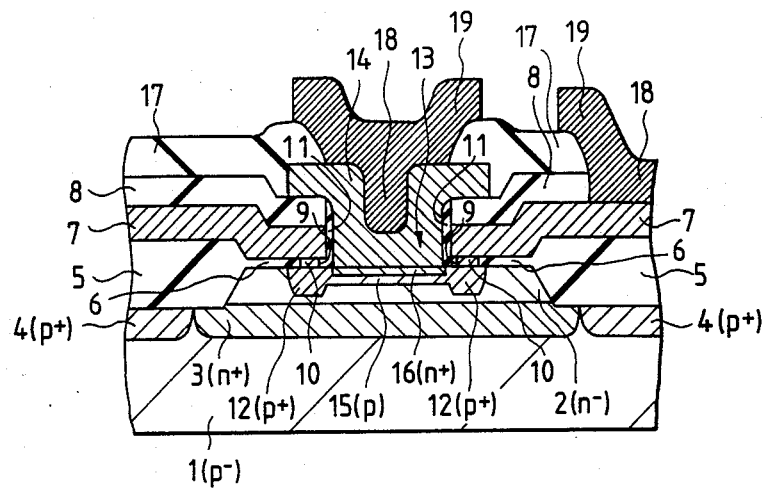
FIG. 1 is a fragmentary sectional view showing a bipolar transistor of a semiconductor integrated circuit device according to one embodiment of the first invention.

The arrangements of the present inventions will be described hereinunder by way of embodiments.

It should be noted that, throughout the drawings illustrating embodiments, elements or portions having the same functions are denoted by the same reference numerals and repetitive description thereof is omitted.

Embodiment I

The embodiment I is one embodiment of the first invention in which the present invention is applied to a semiconductor integrated circuit device having a bipolar transistor.

A bipolar transistor of the semiconductor integrated circuit device according to one embodiment of the first invention is shown in FIG. 1 (fragmentary sectional view).

Referring to FIG. 1, the bipolar transistor is formed on a principal surface of a silicon substrate. The silicon substrate comprises a $p^-$-type semiconductor substrate 1 and an $n^-$-type epitaxial layer 2 grown on a principal surface thereof. In a bipolar transistor forming region, an $n^+$-type semiconductor region (buried collector region) 3 is provided between the semiconductor substrate 1 and the epitaxial layer 2.

The region of the bipolar transistor is defined by an insulating film 5 for isolation, a $p^+$-type semiconductor region 4 and the semiconductor substrate 1 which function as isolation regions. Thus, the bipolar transistor is electrically isolated from other elements. The insulating film 5 for isolation is formed by oxidizing the epitaxial layer 2. The semiconductor region 4 is provided between that portion of the semiconductor substrate 1 which extends underneath the insulating film 5 for isolation and he epitaxial layer 2.

The bipolar transistor is an npn type transistor comprising a collector region, a base region and an emitter region.

The collector region comprises the semi-conductor region (buried collector region) 3, the epitaxial layer 2 and an $n^+$-type semiconductor region (not shown) for pulling up potential. The semiconductor region for pulling up potential is formed a region which is defined by the insulating film 5 for isolation within a region which is different from the bipolar transistor forming region shown in FIG. 1, the semiconductor region for pulling up potential being electrically connected to the semiconductor region 3. The collector region is, although not shown, formed in such a manner that a collector wiring is connected to the semiconductor region for pulling up potential.

The base region comprises a $p^+$-type semiconductor region 12 used as an external base region (also known as "graft base region") and a p-type semiconductor region 15 used as an active-base region (also known as "intrinsic base region"). The semiconductor region 15 is provided in the center of the region surrounded by the semiconductor region 12. The semiconductor region 15 used as an active-base region is electrically connected to the semiconductor region 12 used as an external base region. The semiconductor regions 12 and 15 are provided in the principal surface region of the epitaxial layer 2.

The semiconductor region 12 used as an external base region is electrically connected to a base electrode 7 through a silicon film 10 which is buried in an undercut portion 9. One end portion (inner side) of the base electrode 7 is provided on an insulating film (first insulating film) 6 in such a manner that the base electrode 7 surrounds the periphery of the semiconductor region 15 used as an active-base region. The other end portion (outer side) of the base electrode 7 is led out so as to extend on the upper side of the insulating film 5 for isolation. The base electrode 7 is formed from a polycrystalline silicon film having a p-type impurity (e.g., boron) introduced therein in order to lower the resistance. The silicon film 10 is for example, a polycrystalline silicon film. A base wiring 19 is connected to the upper surface of the base electrode 7 through a contact hole 18 which is formed in an insulating film (second insulating film) 8 formed on the base electrode 7 and an interlayer insulating film 17 formed on the insulating film 8. The base wiring 19 is formed from, for example, an aluminum film or an aluminum alloy film having copper or silicon added thereto.

The emitter region comprises an $n^+$-type semiconductor region 16. The semiconductor region 16 is formed in the principal surface region of the semiconductor region 15 within a region which is defined by the base electrode 7 and an insulating film (a part of the third insulating film; also known as "sidewall") formed on the sidewall portion of the base electrode 7. An emitter electrode 14 is electrically connected to the semiconductor region 16 through a contact hole (emitter opening) 13 the region of which is defined by the insulating film 11. The emitter electrode 14 is formed from, for example, a polycrystalline silicon film having an n-type impurity (e.g., arsenic or phosphorus) introduced therein. The emitter electrode 14 and the base electrode 7 are electrically isolated from each other by the insulating film (second insulating film) 8 provided on the upper side of the base electrode 7 and the insulating film 11 formed on the sidewall portion of the base electrode 7. An emitter wiring 19 is connected to the emitter electrode 14 through a contact hole 18 formed in the interlayer insulating film 17. The emitter wiring 19 is formed using a material of the same conductivity type as that of the base wiring 19 and a collector wiring (not shown).

A method of producing the above-described bipolar transistor will be briefly explained with reference to FIGS. 2 to 9 (fragmentary sectional views of the bipolar transistor in sequential steps of the manufacturing process).

Figure 2:
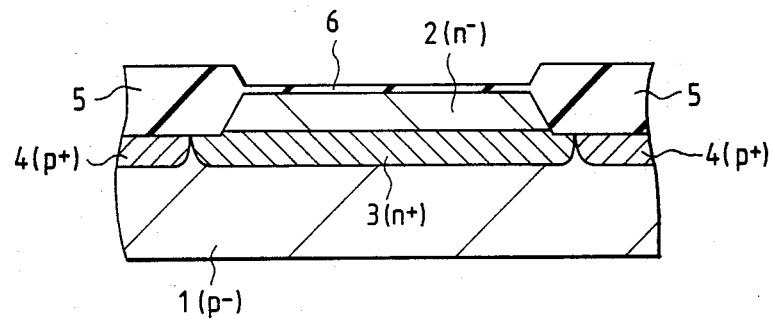
FIGS. 2 to 9 are fragmentary sectional views of the bipolar transistor shown in FIG. 1 in sequential steps of the manufacturing process.

First, a $p^-$-type semiconductor substrate 1 comprising single crystal silicon is prepared, as shown in FIG. 2.

Next, an n-type impurity is introduced into the principal surface region of the semiconductor substrate 1 within a bipolar transistor forming region. Thereafter, a p-type impurity is introduced into the principal surface region of the semiconductor substrate 1 within the region between adjacent bipolar transistor forming regions.

Next, an $n^-$-type epitaxial layer 2 is grown on the principal surface of the semiconductor substrate 1 to form a silicon substrate. As a result of the step of growing the epitaxial layer 2, the introduced n-type impurity is diffused into the principal surface region of the semiconductor substrate 1 to form an $n^+$-type semiconductor region 3 and the introduced p-type impurity is diffused into the principal surface region of the semiconductor substrate 1 to form a $p^+$-type semiconductor region 4.

Next, the principal surface of the epitaxial layer 2 within the region between adjacent bipolar transistor forming regions is locally oxidized to form an insulating film 5 for isolation. The insulating film 5 is formed to such an extent that it is in contact with the semiconductor region 4.

Next, an insulating film (first insulating film) 6 is formed on the principal surface of the epitaxial layer 2 within the bipolar transistor forming region. The insulating film 6 is a silicon oxide film which is formed by oxidizing the principal surface of the epitaxial layer 2, the insulating film 6 having a thickness of about 400 to 600 [Å]. The insulating film 6 is mainly used to electrically isolate the epitaxial layer 2 from a base electrode (7) which is formed in a subsequent step and it is also used as an etching stopper layer when the base electrode (7) is patterned.

Figure 3:
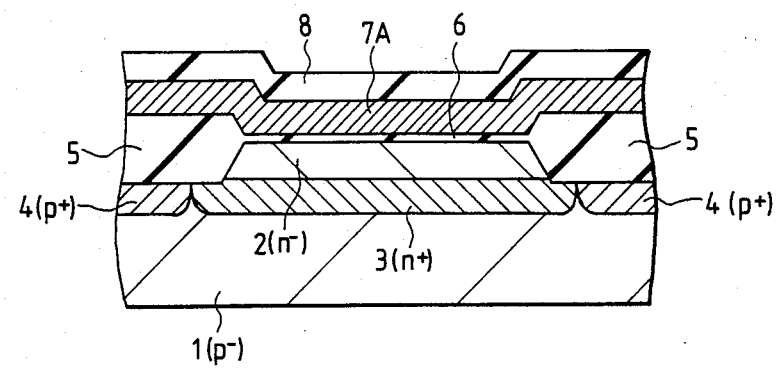

Next, a base electrode forming layer 7A is formed on the whole surface of the substrate including the upper side of the insulating film 6, as shown in FIG. 3. The base electrode forming layer 7A is formed from, for example, a polycrystalline silicon film which is deposited by CVD (Chemical Vapor Deposition) carried out under atmospheric pressure (about 1.0 [torr]), the layer 7A having a film thickness of about 2500 to 3500 [Å]. It should be noted that the base electrode forming layer 7A may also be formed from a silicide film comprising a polycrystalline silicon film and a refractory metal film formed thereon or a composite film comprising a polycrystalline silicon film and a refractory metal silicide film stacked thereon.

Next, a p-type impurity (e.g., boron) is introduced into the base electrode forming layer 7A at high concentration to lower the resistance of the layer 7A.

Next, an insulating film (second insulating film) 8 is formed on the whole surface of the base electrode forming layer 7A. The insulating film 8 is for example, a silicon oxide film which is deposited by CVD, the insulating film 8 having a thickness of about 2000 to 3000 [Å].

Figure 4:
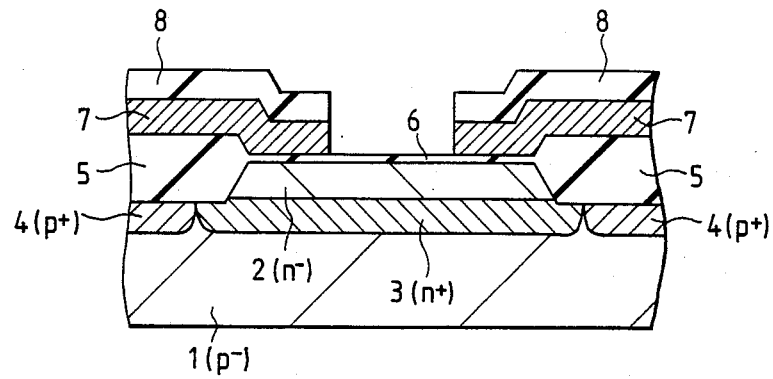

Next, as shown in FIG. 4, the insulating film 8 and the base electrode forming layer 7A are subjected to predetermined patterning to form a base electrode 7. This patterning is carried out in such a manner as to remove the base electrode forming layer 7A from the region for forming an active-base region and emitter region of the bipolar transistor. The patterning is effected by an anisotropic etching process such as RIE with a view to increasing the processing accuracy of the base electrode 7 and allowing the sidewall of the base electrode 7 to have a steep step configuration. Such an anisotropic etching enables the insulating film (second insulating film) 8 and the base electrode forming layer 7A to be lap-cut. As an etching gas, for example, CHF$_3$ or CF$_4$ may be used.

When this anisotropic etching is carried out, the insulating film 6 underlying the base electrode forming layer 7A is used as an etching stopper layer. The insulating film 6 is used to protect the surface of the single crystal silicon epitaxial layer 2 within the region for forming an active-base region and emitter region.

Figure 5:
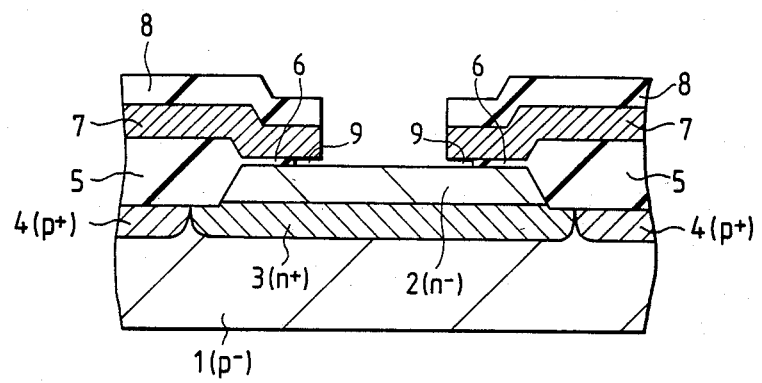

Next, as shown in FIG. 5, the insulating film 6 which is exposed through the opening provided in the base electrode 7 is removed by an isotropic etching process and the insulating film 6 which is formed underneath the end portion of the base electrode 7 on the side thereof which is closer to the region for forming an active-base region, emitter region and emitter electrode is also removed by side-etching to form an undercut portion 9. The undercut portion 9 is formed in such a manner that it is recessed about 1000 [Å] from the end of the base electrode 7 in the horizontal direction (the direction parallel with the plane of the substrate 1). As an isotropic etching liquid, for example, hydrofluoric acid may be used.

Figure 6:
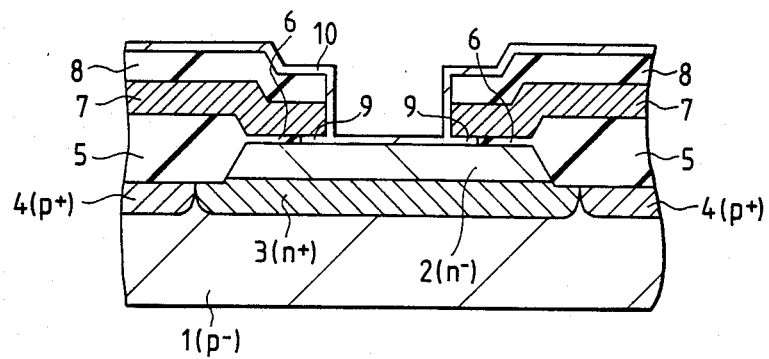

Next, as shown in FIG. 6, a silicon film 10 is formed on the whole surface of the substrate in such a manner that the undercut portion 9 is filled with the silicon film 10. The silicon film 10 is a polycrystalline silicon film which is deposited by CVD carried out under low pressure (about 0.3 [torr]or less). The silicon film 10 is formed with a thickness of, for example, about 200 to 300 [Å], so that the undercut portion 9 is substantially completely filled with the silicon film 10. According to the basic research conducted by the present inventors, a polycrystalline silicon film which is deposited by low pressure CVD can be reliably buried inside the undercut portion 9 which is formed with a very small size, as described above. The silicon film 10 buried in the undercut portion 9 is connected to the undersurface of the base electrode 7.

Figure 7:
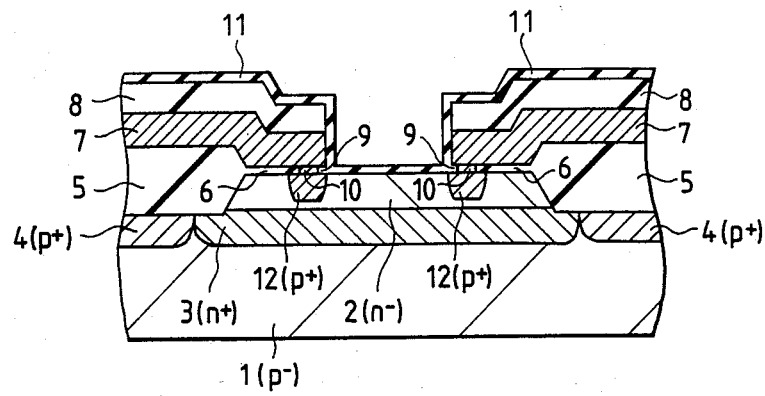

Next, as shown in FIG. 7, the silicon film 10 is formed (or changed) into an insulating film (third insulating film) 11 except for at least a part of that buried in the undercut portion 9. The insulating film (third insulating film) 11 is a silicon oxide film which is formed by subjecting the whole surface of the silicon film 10 to thermal oxidation. A part of the silicon film 10 which is buried in the undercut portion 9, more specifically, that part of the silicon film 10 which extends about 200 to 300 [Å] from the sidewall portion of the base electrode 7 in the horizontal direction (the direction parallel with the plane of the substrate), is formed into the insulating film 11.

As a result of the thermal oxidation step carried out to form the insulating film 11, the p-type impurity introduced in the base electrode 7 is diffused into the principal surface region of the epitaxial layer 2 through the silicon film 10 remaining in the undercut portion 9 to form a p$^+$-type semiconductor region 12 used as an external base region of a bipolar transistor. The size (about 700 to 800 [Å] in the horizontal direction) of the region into which the p-type impurity in the base electrode 7 is diffused is determined by the amount of side-etching of the insulating film (first insulating film) 6 and the amount in which the silicon film 10 buried in the undercut portion 9 formed by the side-etching is partly formed into the insulating film 11 by oxidation. Therefore, the semiconductor region 12 used as an external base region can be formed with a considerably smaller size than the minimum size attained in the case of processing using photolithography technique. The semiconductor region 12 used as an external base region can be formed in self-alignment with respect to the base electrode 7. It should be noted that the step in which the semiconductor region 12 used as an external base region is formed is not necessarily limited to the thermal oxidation step carried out to form the insulating film 11 and the semiconductor region 12 may be formed in a heat-treating step carried out thereafter, for example, the same heat-treating step as that in which an active-base region or an emitter region is formed, or in another step which is carried out after such a heat-treating step.

Figure 8:
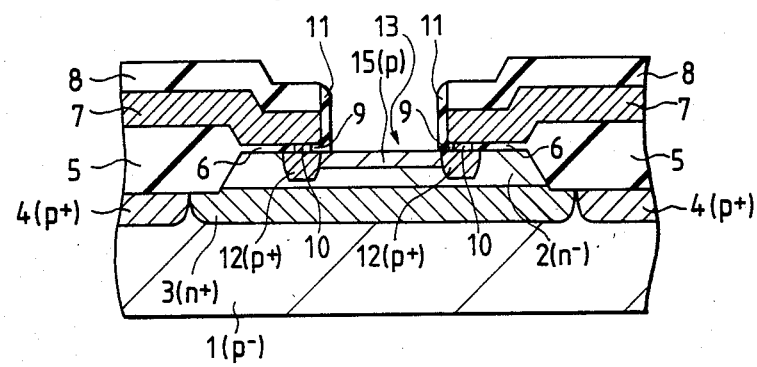

Next, as shown in FIG. 8, the insulating film 11 is removed by an amount corresponding to its thickness from the region for forming an active-base region, emitter region and emitter electrode, thereby forming a contact hole 13. Thereafter, a p-type semiconductor region 15 used as an active-base region is formed on the principal surface of the epitaxial layer 2 within the region having the insulating film 11 removed therefrom.

The removal of the insulating film 11 is effected by an anisotropic etching process such as RIE. Employment of such an anisotropic etching process enables a part of the insulating film 11 to remain on the sidewall portion of the base electrode 7 so as to be used as a sidewall spacer. The remaining part (sidewall spacer) of the insulating film 11 is formed in self-alignment with respect to the base electrode 7. Since the insulating film 11 is formed by utilizing the silicon film 10, it is possible to eliminate the need to carry out a step of depositing another insulating film for electrically isolating the base electrode 7 from an emitter electrode (14) which is formed in a subsequent step. The thickness of the remaining part (sidewall spacer) of the insulating film 11 can be readily controlled with the amount in which the anisotropic etching is carried out and it is possible to form a thin sidewall spacer, i.e., about several thousands [Å] from the sidewall portion of the base electrode 7.

Since the insulating film 11 is formed using a silicon oxide film ($SiO_2$), it is possible to increase the ratio of etch rates between the insulating film 11 and the epitaxial layer (Si) 2 in anisotropic etching of the insulating film 11. The ratio of etch rates between the two materials, that is, selectivity, is, for example, about $SiO_2$:Si=10:1. Accordingly, it is possible to reduce roughing or damage of the surface of the epitaxial layer 2 in the region for forming an active-base region, emitter region and emitter electrode at the time of removal of the insulating film 11.

The semiconductor region 15 used as an active-base region can be formed by introducing a p-type impurity into the principal surface region of the epitaxial layer 2 by ion implantation. Since the p-type impurity is introduced within the region which is defined by the base electrode 7 and the insulating film 11 remaining on the sidewall portion thereof, that is, within the contact hole 13, the semiconductor region 15 is formed in self-alignment with respect to the base electrode 7.

Figure 9:
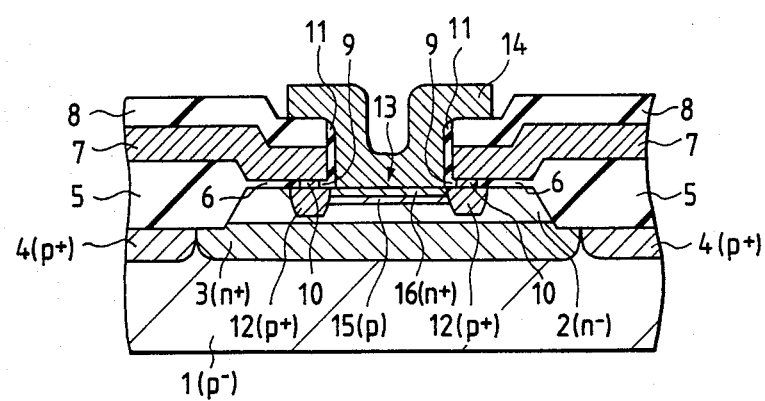

Next, as shown in FIG. 9, an emitter electrode 14 is formed in such a manner that it is electrically connected to the semiconductor region 15 used as an active-base region through the contact hole 13. Thereafter, an $n^+$-type semiconductor region 16 used as an emitter region is formed.

The emitter electrode 14 is formed using a polycrystalline silicon film which is deposited by atmospheric CVD, the emitter electrode 14 having an n-type impurity (e.g., arsenic or phosphorus) introduced therein.

The semiconductor region 16 used as an emitter region is formed by introducing an n-type impurity into the principal surface region of the semiconductor region 15 through the emitter electrode 14. The semiconductor region 16 may be formed by diffusing the n-type impurity in the emitter electrode 14 into the semiconductor region 15.

Thus, in a semiconductor integrated circuit device having a bipolar transistor, when the base electrode forming layer 7A comprising a silicon film as a principal constituent and the insulating film (second insulating film) 8 which are successively deposited on the principal surface of the silicon substrate (1, 2) through the insulating film (first insulating film) 6 are patterned by an anisotropic etching process to form the base electrode 7, the surface of the silicon substrate (epitaxial layer 2) within the emitter and base forming region is covered with the insulating film 6 underlying the base electrode forming layer 7A and it is therefore possible to reduce roughing or damage of the surface of the epitaxial layer 2. Further, the silicon film 10 is formed into the insulating film (third insulating film) 11 except for at least a part of the silicon film 10 which is buried in the undercut portion 9 and thereafter the insulating film 11 within the region for forming the emitter and base of a bipolar transistor is removed by etching. Accordingly, since the ratio of etch rates between the insulating film 11 and the silicon substrate (epitaxial layer 2) is high, it is possible to reduce roughing or damage of the surface of the silicon substrate (epitaxial layer 2) within the emitter and base forming region. As a result, it is possible to improve the electrical characteristics of the bipolar transistor.

Since the size of the region into which the p-type impurity in the base electrode 7 is diffused can be determined by the side etching amount of the insulating film (first insulating film) 6 and the amount of formation of the insulating film 11 within the undercut portion 11 (the amount of oxidation of the silicon film 10), it is possible to reduce the size of the semiconductor region 12 used as an external base region and hence achieve high integration.

Further, since the semiconductor region 12 used as an external base region, the semiconductor region 15 used as an active-base region, the semiconductor region 16 used as an emitter region and the emitter electrode 14 can be formed in self-alignment with respect to the base electrode 7, it is possible to reduce the occupied area of the bipolar transistor by an amount corresponding to an allowance made for mask alignment carried out in the manufacturing process and hence possible to achieve high integration.

Since the semiconductor region 12 used as an external base region can be formed with a small size only within a part of th undercut portion 9, it is possible to reduce the pn junction capacitance between the semiconductor region 12 and the epitaxial layer 2 constituting the collector region. Therefore, it is possible to increase the operating speed of the bipolar transistor.

After the step of forming the semiconductor region 16 used as an emitter region, which is shown in FIG. 9, an interlayer insulating film 17 and contract holes 18 are successively formed, as shown in FIG. 1.

Next, an emitter wiring 19, a base wiring 19 and a collector wiring are formed. By carrying out the above-described series of steps of the manufacturing process, the semiconductor integrated circuit device according to the embodiment I is completed.

In the case where a semiconductor integrated circuit is formed with a view to increasing the operating speed, it is preferable to form the circuit using bipolar transistors only. However, the present invention is not necessarily limited to semiconductor integrated circuits comprising bipolar transistors only and it is also possible to form a semiconductor integrated circuit of the hybrid type in which bipolar transistors and complementary MISFETs (CMOS) are combined together.

Further, in the present invention, a trench type isolation region, that is, a trench formed in a semiconductor substrate, may be used in place of the insulating film 5 for isolation. In this case, the MIS capacitance between the base electrode 7 and the epitaxial layer 2 can be made lower thanin the case of the insulating film 5 for isolation; therefore, it is possible to further increase the operating speed of the bipolar transistor.

It should be noted that the present invention is not necessarily limited to npn type bipolar transistors but may also be applied to pnp type bipolar transistors.

When the first invention is applied to pnp bipolar transistors, it is possible to reduce roughing or damage of the surface of the collector region.

Embodiment II

The embodiment II is one embodiment of the second invention in which the present invention is applied to a semiconductor integrated circuit device having a MISFET.

Figure 10:
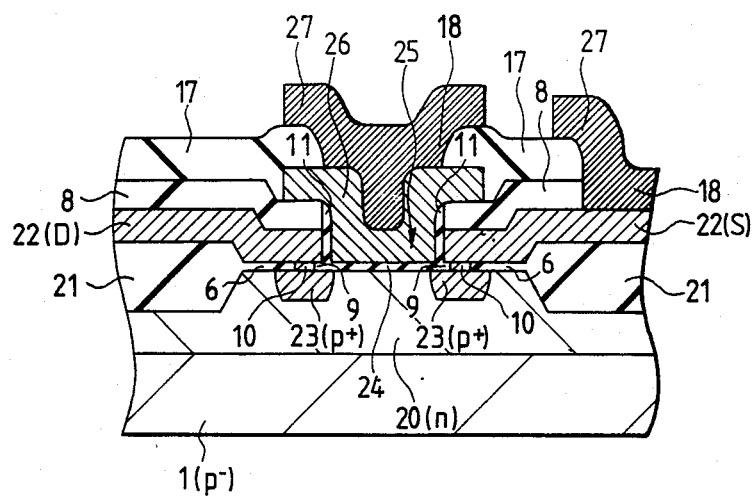
FIG. 10 is a fragmentary sectional view showing a MISFET of a semiconductor integrated circuit device according to one embodiment of the second invention.

A MISFET of the semiconductor integrated circuit device according to one embodiment of the second invention is shown in FIG. 10 (fragmentary sectional view).

Referring to FIG. 10, the MISFET is formed on a principal surface of a silicon substrate. The silicon substrate comprises a $p^-$-type semiconductor substrate 1 and an n-type well region 20 which is formed in the principal surface region of the substrate 1.

The region of the MISFET is defined by an insulating film 21 for isolation and the MISFET is electrically isolated from other elements by the insulating film 21. The insulating film 21 is formed by oxidizing the principal surface of the well region 20

The MISFET comprises the well region 20, gate insulating film 24, gate electrode 26 and a pair of $p^+$-type semiconductor regions 23 used as source and drain regions In other words, the MISFET is a p-channel type MISFET.

The well region 20 is used as a channel forming region.

The semiconductor region 23 used as a source region is connected to a source electrode (S) 22 through a silicon film 10 buried in an undercut portion 9. Similarly, the semiconductor region 23 used as a drain region is connected to a drain electrode (D) 22 through a silicon film 10 buried in another undercut portion 9. One end portion of each of the source and drain electrodes 22 is provided on an insulating film (first insulating film) 6, while the other end portion is led out so as to extend on the upper side of the insulating film 21 for isolation. Each of the source and drain electrodes 22 is formed from a polycrystalline silicon film having a p-type impurity introduced therein in order to lower the resistance in the same way as in the case of the base electrode 7 in the embodiment I. The other end portion of the source electrode 22 is connected to a source wiring 27 through a contact hole 18, and the other end portion of the drain electrode 22 is connected to a drain wiring 27 (not shown) through another contact hole 18. The source wiring 27 and the drain wiring 27 (not shown) are formed using, for example, an aluminum film or an aluminum alloy film containing copper or silicon.

The gate electrode 26 is provided within a region which is defined by the source electrode 22, the drain electrode 22 and an insulating film (third insulating film) 11 formed on the sidewall portion of each of the electrodes 22, that is, within a contact hole 25, through a gate insulating film (fourth insulating film) 24 which is provided on the principal surface of the well region 20. The gate electrode 26 is formed from, for example, a polycrystalline silicon film having an n-type impurity (e.g., arsenic or phosphorus) introduced therein. A gate wiring 27 is connected to the gate electrode 26 through a contact hole 18.

The method of producing the foregoing MISFET will be briefly described with reference to FIGS. 11 to 18 (fragmentary sectional views of the MISFET in sequential steps of the manufacturing process).

Figure 11:
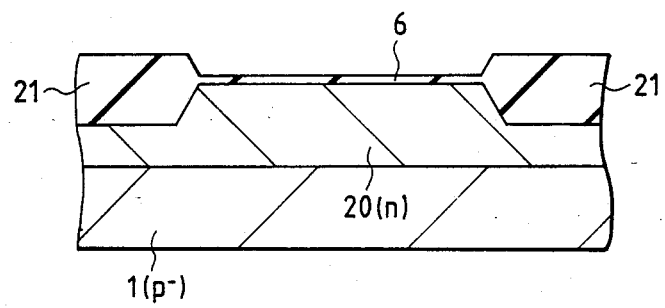
FIGS. 11 to 18 are fragmentary sectional views of the MISFET shown in FIG. 10 in sequential steps of the manufacturing process.

First, a $p^-$-type semiconductor substrate 1 made of single crystal silicon is prepared, as shown in FIG. 11.

Next, an n-type well region 20 is formed in a principal surface region of the semiconductor substrate 1 within a MISFET forming region.

Next, the principal surface of the well region 20 in the area between adjacent MISFET forming regions is locally oxidized to form an insulating film 21 for isolation.

Next, an insulating film (first insulating film) 6 is formed on the principal surface of the well region 20 within the MISFET forming region which is defined by the insulating film 21 for isolation. The insulating film 6 is used to electrically isolate the well region 20 from source and drain electrodes (22) which are formed in a subsequent step and it is also used as an etching stopper layer when the source and drain electrodes (22) are patterned, in the same way as in the case of the insulating film 6 of the embodiment I.

Figure 12:
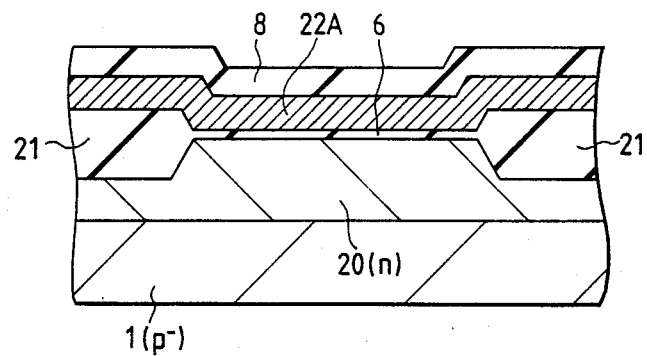

Next, as shown in FIG. 12, an electrode forming layer (source and drain electrode forming layer) 22A is formed on the whole surface of the substrate including the upper side of the insulating film 6. The electrode forming layer 22A is formed using, for example, a polycrystalline silicon film which is deposited by atmospheric CVD.

Next, a p-type impurity is introduced into the electrode forming layer 22A at high concentration to lower the resistance.

Next, an insulating film (second insulating film) 8 is formed on the whole surface of the electrode forming layer 22A.

Figure 13:
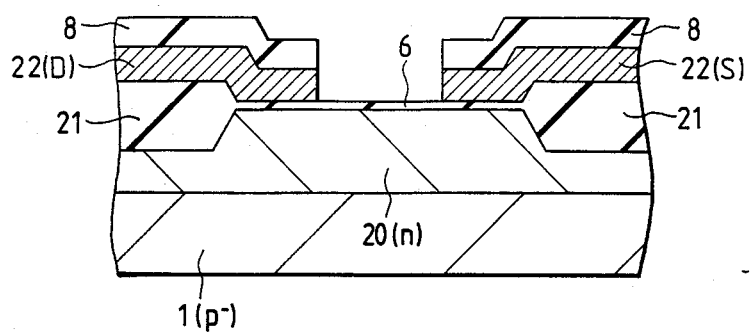

Next, as shown in FIG. 13, the insulating film 8 and the electrode forming layer 22A are subjected to predetermined patterning to form a source electrode (S) 22 and a drain electrode (D) 22. This patterning is carried out in such a manner that the electrode forming layer 22A in the gate electrode forming region is removed. The patterning is effected by an anisotropic etching process such as RIE.

When the anisotropic etching process is carried out, the insulating film 6 underlying the electrode forming layer 22A is used as an etching stopper layer. More specifically, the insulating film 6 protects the surface of the well region 20 in the gate electrode forming region.

Figure 14:
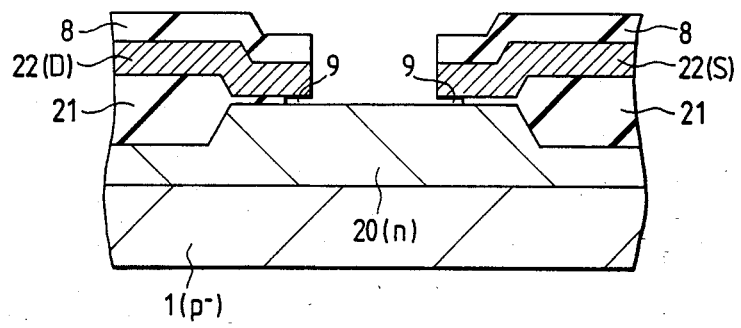

Next, as shown in FIG. 14, the insulating film (first insulating film) 6 which is exposed through the region defined by the source electrode (S) 22 and the drain electrode (D) 22 is removed by an isotropic etching process. In addition, the insulating film 6 which is formed underneath the end portions of the source and drain electrodes 22 is removed by side-etching to form undercut portions 9.

Figure 15:
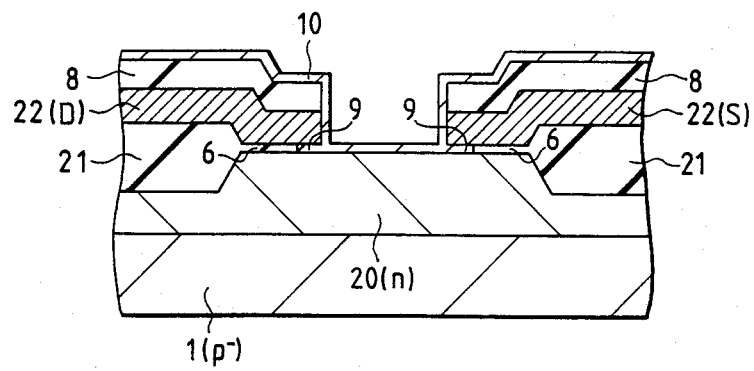

Next, as shown in FIG. 15, a silicon film 10 is formed on the whole surface of the substrate in such a manner that the undercut portions 9 are filled with the silicon film 10. The silicon film 10 is a polycrystalline silicon film which is deposited by CVD carried out under low pressure (about 0.3 [torr] or less).

Figure 16:
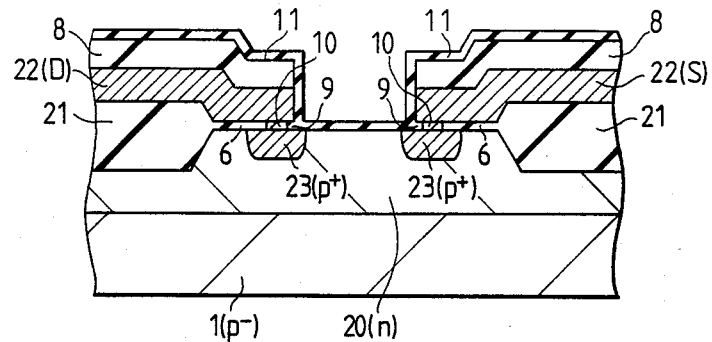

Next, as shown in FIG. 16, the silicon film 10 is formed (or changed) into an insulating film (third insulating film) 11 except for at least a part of the silicon film 10 buried in each undercut portion 9. The insulating film 11 is a silicon oxide film which is formed by subjecting the whole surface of the silicon film 10 to thermal oxidation.

As a result of the thermal oxidation step carried out to form the insulating film 11, the p-type impurity introduced into the source and drain electrodes 22 is diffused into the principal surface region of the well region 20 through the silicon films 10 remaining in the respective undercut portions 9 to form a pair of p+-type semiconductor regions 23 used as source and drain regions, as shown in FIG. 16.

Figure 17:
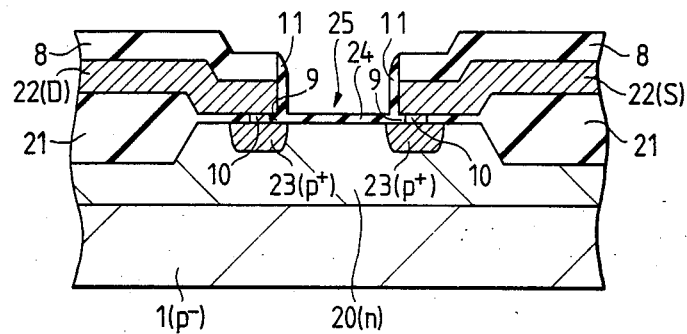

Next, as shown in FIG. 17, the insulating film (third insulating film) 11 is removed by an amount corresponding to its thickness from the gate electrode forming region to expose the surface of the well region 20 within a region which functions as a channel region 20A of the MISFET. Thereafter, a gate insulating film (fourth insulating film) 24 is formed on the principal surface of the well region 20 separately from the insulating film 11 on the channel region. The gate insulating film 24 is a silicon oxide film which is formed by oxidizing the principal surface of the well region 20, the film 24 having a thickness of about 200 to 300 [Å].

The removal of the insulating film 11 is effected by an anisotropic etching process such as RIE. Employment of such an anisotropic etching process enables a part of the insulating film 11 to remain on the sidewall portion of each of the source and drain electrodes 22 so as to be used as a sidewall spacer.

Since the insulating film 11 is formed using a silicon oxide film, it is possible to increase the ratio of etch rates between the insulating film 11 and the well region 20 (single crystal silicon region) when the insulating film 11 is removed by an anisotropic etching process in the same way as in the embodiment I. Accordingly, it is possible to reduce roughing or damage of the surface of the well region 20 in the gate electrode forming region when the insulating film 11 is removed.

Figure 18:
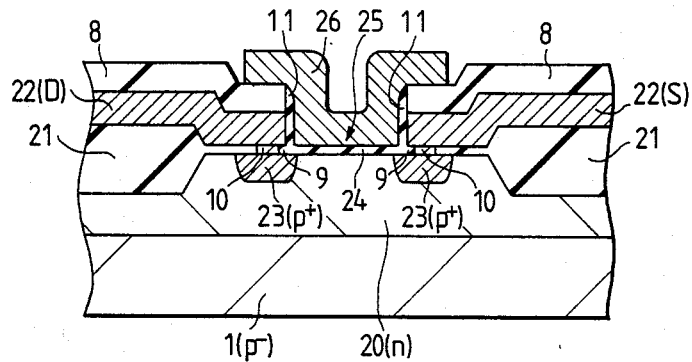

Next, as shown in FIG. 18, a gate electrode 26 is formed on the principal surface of the well region 20 through a contact hole 25 with the gate insulating film 24 interposed therebetween. The gate electrode 26 is formed from, for example, a polycrystalline silicon film which is deposited by atmospheric CVD, the gate electrode 26 having an n-type impurity (e.g., phosphorus or arsenic) introduced therein.

Thus, the second invention provides a method for manufacturing a semiconductor integrated circuit device having a MISFET which comprises the steps of: depositing an electrode forming layer 22A including a silicon film as a principal constituent on a principal surface of a silicon substrate (1, 20) through an insulating film 6; introducing an impurity into the electrode forming layer 22A, the impurity having a conductivity type which is opposite to that of the silicon substrate (well region 20); patterning the electrode forming layer 22A by an anisotropic etching process to form a source electrode (S) 22 and a drain electrode (D) 22 which are spaced apart from each other at a predetermined spacing; side-etching the insulating film 6 underneath the respective end portions of the source and drain electrodes 22 which face each other by an isotropic etching process to form undercut portions 9; depositing a silicon film 10 on the whole surface of the substrate in such a manner that the undercut portions 9 are filled with the silicon film 10; forming the silicon film 10 into an insulating film 11 except for that buried in a part of each undercut portion 9; removing that part of the insulating film 11 which extends between the source and drain electrodes 22 to expose the surface of the silicon substrate (20); and forming a gate electrode 26 on the exposed surface of the silicon substrate with a gate insulating film 24 interposed therebetween. The second invention also has the step of diffusing the impurities introduced in the source and drain electrodes 22 into the principal surface region of the silicon substrate (20) through the silicon film 10 buried in at least a part of each undercut portion 9 to form a pair of semiconductor regions 23 used as source and drain regions, respectively, said step being carried out in the same step as that of forming the insulating film 11 or a step carried out thereafter.

By virtue of the manufacturing method of the present invention, when the electrode forming layer 22A is subjected to an anisotropic etching process to form source and drain electrodes 22, the surface of the silicon substrate (20) within the gate insulating film forming region is covered with the insulating film 6 underlying the electrode forming layer 22A and it is therefore possible to reduce roughing or damage of the surface of the silicon substrate (20). Further, after the silicon film 10 has been formed into the insulating film 11 except for that buried in a part of each undercut portion 9, that part of the insulating film 11 which is within the gate electrode forming region is removed by etching. Accordingly, it is possible to reduce roughing or damage of the surface of the silicon substrate (20) within the gate insulating film forming region by virtue of the high ratio of etch rates between the insulating film 11 and the silicon substrate (20).

Since the sizes of regions into which the impurities in the source and drain electrodes 22 are diffused to form a pair of semiconductor regions 23 used as source and drain regions, respectively, can be determined by the amount of side etching of the insulating film (first insulating film) 6 and the amount of formation of the insulating film 11 in each undercut portion 9 (i.e., the amount of oxidation of the silicon film 10), it is possible to reduce the respective sizes of the semiconductor regions 23 and hence increase the integration density of the MISFET.

Since the pn junction capacitance between a pair of semiconductor regions 23 used as source and drain regions and the silicon substrate (20) can be reduced, it is possible to increase the operating speed of the MISFET Further, since the pair of semiconductor regions 23 used as source and drain regions and the gate electrode 26 can be formed in self-alignment with respect to the source and drain electrodes 22, it is possible to increase the integration density of the MISFET by an amount corresponding to an allowance made for mask alignment carried out in the manufacturing process.

After the step of forming the gate electrode 26, which is shown in FIG. 18, an interlayer insulating film 17 and contact holes 18 are successively formed, as shown in FIG. 10. Thereafter, a source wiring 27, a drain wiring (not shown) and a gate wiring 27 are formed through the respective contact holes 18.

By carrying out the above-described series of steps of the manufacturing process, the semiconductor integrated circuit device according to the embodiment II is completed.

It should be noted that the present invention is not necessarily limited to p-channel MISFETs but may also be applied to n-channel MISFETs.

The present invention may also be applied to a semiconductor integrated circuit device of the hybrid type in which bipolar transistor according to the embodiment I and the MISFET according to the embodiment II are combined together In this case, it is advantageously possible to use many manufacturing steps in common, for example, the step of forming the base electrode 7 and the step of forming the source and drain electrodes 22.

The present invention may also be applied to a Bi-CMOS device in which a bipolar transistor, an P-channel type MISFET and an N-channel type MISFET are mixedly fabricated on the same semiconductor substrate. One embodiment in which the present invention is applied to a Bi-CMOS device is shown in FIG. 19. The method of manufacturing the Bi-CMOS device shown in FIG. 19 will be briefly described below.

As shown in FIG. 19, an $n^+$-type buried layer 3 and a $p^+$-type buried layer 4 are formed in predetermined regions, respectively, on a principal surface of a $p^-$-type semiconductor substrate 1 by known techniques. Thereafter, an epitaxial layer of single crystal silicon is formed on the whole surface of the semiconductor substrate 1 and a p-type isolation region 4A, a p-type well region 4B and an n-type well region 20 are formed in the epitaxial layer by selective ion implantation and diffusion of impurities. Further, the surface of the epitaxial layer is locally subjected to thermal oxidation to form an insulating film 5 for isolation.

The bipolar transistor forming region and the MISFET forming regions are electrically isolated from each other by the p-type isolation region 4A, the $p^+$-type buried layer 4, the $p^-$-type semiconductor substrate 1 and the insulating film 5 for isolation. After the insulating film 5 has been formed, an $n^+$-type collector potential lead-out region 300 is formed in the n-well region 20 within the bipolar transistor forming region by selective ion implantation and diffusion of an n-type impurity (e.g., phosphorus).

The manufacturing process carried out thereafter can be readily achieved by combining together the embodiments I and II of the present invention. For example, the base electrode 7, the source and drain electrodes 22 of the P-channel type MISFET and the source and drain electrodes 22A of the N-channel type MISFET can be formed using polycrystalline silicon films which are formed in the same step. In such a case, a p-type impurity is ion-implanted into the base electrode 7 and the source and drain electrodes 22, while an n-type impurity is ion-implanted into the source and drain electrodes 22A. In this case, since selective ion implantation of p- and n-type impurities is carried out, the number of photomasks used increase by one. Further, the emitter electrode 14, the gate electrode 26 of the P-channel MISFET and the gate electrode 26 of the N-channel MISFET can also be formed using polycrystalline silicon films which are formed in the same step. It is also possible to vary the respective conductivity types of the gate electrodes of the P- and N-channel type MISFETs by elective ion implantation of impurities so that each MISFET can have a predetermined threshold voltage, although the number of photomasks used increases by one.

Figure 20:
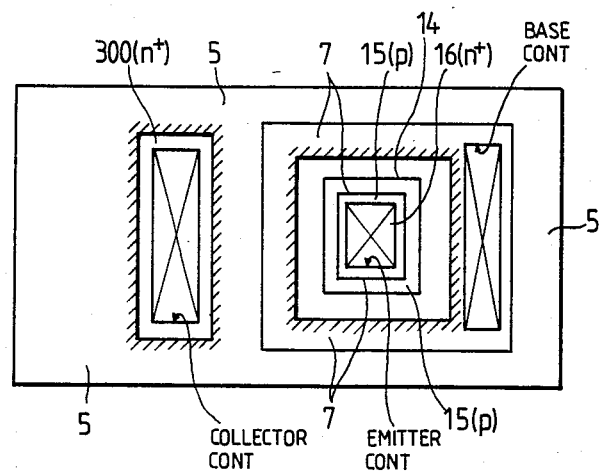
FIG. 20 is a fragmentary plan view of a bipolar transistor region of the Bi-CMOS device shown in FIG. 19.
Figure 21:
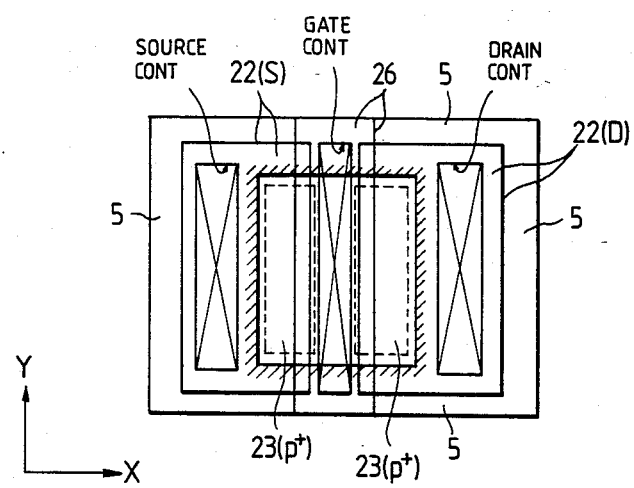
FIG. 21 is a fragmentary plan view of a P-channel type MISFET region of the Bi-CMOS device shown in FIG. 19.

FIGS. 20 and 21 are fragmentary plan views respectively showing the bipolar transistor and P-channel type MISFET forming regions of the Bi-CMOS device shown in FIG. 19.

The bipolar transistor is laid out as shown in FIG. 20. No insulating films except for the insulating film 5 for isolation are illustrated for simplification of the drawing. As will be clear from the figure, the base electrode 7 is formed in such a manner as to surround the emitter region 16 ($n^+$). The base potential is supplied from an interconnection layer 19 through a contact hole (Base CONT) formed above the base electrode 7. The emitter electrode 14 is formed in such a manner as to overlap the upper side of the base electrode 7. The emitter potential is supplied from an interconnection layer 19 through a contact hole (Emitter CONT) formed above the emitter electrode 14. Also to the $n^+$-type collector potential lead-out region 300 is connected an interconnection layer 19 through a contact hole (Collector CONT) It will be understood that, by virtue of this layout of the bipolar transistor, it is possible to form the emitter region 16($n^+$), the external base region 12 ($p^+$), the intrinsic base region 15 (p) and the emitter electrode 14 in self-alignment with respect to the base electrode 7. The Base CONT may be formed above the base electrode 7 which is in opposing relation to it.

The P-channel type MISFET is laid out as shown in FIG. 21. No insulating films except for the insulating film 5 for isolation are illustrated in the same way as in FIG. 20.

As shown in FIG. 21, the source electrode 22(S) and the drain electrode 22(D) are formed in such a manner as to face each other across the gate electrode 26. Interconnection layers 27 and 27A are connected to the source electrode 22(S) and the drain electrode 22(D) through contact holes (Source CONT, Drain CONT), respectively. The source and drain regions 23($p^+$) are self-alignedly formed below the source and drain electrodes 22(S) and 22(D), respectively, by diffusion of a p-type impurity from the respective electrodes. The gate electrode 26 is formed in such a manner as to overlap the upper sides of the source and drain electrodes 22(S) and 22(D). An interconnection layer 27 is connected to the gate electrode 26 through a contact hole (Gate CONT). The connection of the gate electrode 26 and the interconnection layer 27 does not necessarily need to be made within the active region surrounded by the insulating film 5 for isolation. For example, the gate electrode 26 may be extended in the direction Y so that it is connected to the interconnection layer 27 on the insulating film 5 for isolation. Further, it is possible to form the N-channel MISFET shown in FIG. 19 simply by exchanging the p-type impurity for an n-type impurity.

Although the inventions accomplished by the present inventors have been described specifically by way of embodiments, it should be noted that the inventions are not necessarily limitative to the described embodiments and various changes and modifications may be imparted thereto without departing from the gist of the invention.

The following is a brief description of the advantages obtained by carrying out the first and second inventions disclosed in the present application.

According to the first invention, it is possible to achieve high integration and high-speed operation in a semiconductor integrated circuit device having a bipolar transistor and it is also possible to reduce roughing or damage of the substrate surface in the emitter region and hence improve the electrical characteristics.

According to the second invention, it is possible to achieve high integration and high-speed operation in a semiconductor integrated circuit device having a MISFET and it is also possible to reduce roughing or damage of the substrate surface in the gate electrode forming region and hence improve the electrical characteristics.

What is claimed is:

1. A method for manufacturing a semiconductor integrated circuit having a bipolar transistor in which an emitter electrode in led out from a region surrounded by a base electrode, comprising the steps of:
   (a) successively forming a first insulating film, a base electrode forming layer including a silicon film as a principal constituent and a second insulating film on a principal surface of a silicon substrate;
   (b) patterning said base electrode forming layer by an anisotropic etching process to form a base electrode;
   (c) side-etching said first insulating film underneath the end portion of said base electrode on the side thereof which is closer to an emitter electrode forming region which is surrounded by said base electrode by an isotropic etching process to form an under cut portion;
   (d) depositing a silicon film on the whole surface of said substrate in such a manner that said undercut portion is filled with said silicon film;
   (e) forming said silicon film into a third insulating film except for that part of said silicon film which is buried in said undercut portion;
   (f) removing said third insulating film from the emitter electrode forming region by etching to expose the surface of said silicon substrate, the removing of the third insulating film being performed by anisotropic etching; and
   (g) forming an emitter electrode on the exposed surface of said silicon substrate.

2. A manufacturing method according to claim 1, wherein said base electrode has an impurity of a predetermined conductivity type introduced therein, the impurity introduced in said base electrode being diffused into the principal surface region of said silicon substrate through said silicon film buried in said undercut portion to form an external base region.

3. A manufacturing method according to claim 2, wherein the size of said external base region is determined by the extent to which the impurity in said base electrode is diffused, said external base region being formed in self-alignment with respect to said base electrode.

4. A manufacturing method according to claim 1, wherein said silicon film buried in said undercut portion is a polycrystalline silicon film which is 5. A manufacturing method according to claim 1, wherein said base electrode and said emitter electrode are electrically isolated from each other by means of the third insulating film remaining on the sidewall portion of said base electrode after said third insulating film has been subjected to the anisotropic etching process.

6. A manufacturing method according to claim 1, wherein each of said first and third insulating films is a silicon oxide film.

7. A manufacturing method according to claim 1, wherein an active-base region of said bipolar transistor is formed by introducing an impurity of a predetermined conductivity type into the principal surface region of said silicon substrate within the region which is surrounded by said base electrode and an emitter region of said bipolar transistor is formed by introducing an impurity of a predetermined conductivity type into the principal surface region of said silicon substrate within the region surrounded by said base electrode through said emitter electrode.

8. A manufacturing method according to claim 1, wherein, in said patterning said base electrode layer, a sidewall portion of the base electrode, closest to the emitter electrode forming region, is provided; the silicon film is deposited on said sidewall portion in said depositing the silicon film on the whole surface of the substrate; the silicon film on said sidewall portion is formed into said third insulating film in said forming said silicon film into the third insulating film; and, in said removing said third insulating film from the emitter electrode forming region, the third insulating film on said sidewall portion remains on the sidewall portion.

9. A manufacturing method according to claim 8, wherein said base electrode and said emitter electrode are electrically isolated from each other by means of the third insulating film remaining on the sidewall portion of said base electrode after said third insulating film has been subjected to the anisotropic etching process.

10. A manufacturing method according to claim 1, wherein a predetermined impurity is introduced through the emitter electrode so as to form an emitter region of the bipolar transistor.

11. A manufacturing method according to claim 1, wherein said base electrode forming layer is formed of a polycrystalline silicon film, a composite layer comprising a polycrystalline silicon film and a refractory metal silicide film stacked thereon, or a layer comprising a polycrystalline silicon film and a refractory metal film stacked thereon.

12. A manufacturing method according to claim 1, wherein the isotropic etching process for side-etching the first insulating film is performed by wet etching.

13. A manufacturing method according to claim 1, wherein the silicon film is deposited on the whole surface of said substrate, including so as to fill the undercut portion, by chemical vapor deposition carried out under low pressure.

14. A manufacturing method according to claim 1, wherein, in forming said silicon film into the third insulating film, a portion of said part of said silicon film which is buried in said undercut portion is formed into the third insulating film, the remainder of the buried part remaining as silicon.

15. A manufacturing method according to claim 14, wherein said portion of the buried part of the silicon film which is formed into the third insulating film is a portion extending from a position closest to the emitter electrode forming region.

16. A manufacturing method according to claim 1, wherein the silicon film is formed into the third insulating film by thermal oxidation of the silicon film.

17. A manufacturing method according to claim 16, wherein the base electrode includes impurities of a predetermined conductivity type, and said impurities diffuse into the substrate, through the part of the silicon film buried in the undercut portion, during the thermal oxidation to form the third insulating film, so as to form an external base region of the bipolar transistor, whereby the external base region is formed in self-alignment with the base electrode.

18. A manufacturing method according to claim 1, wherein, after said removing said third insulating film and prior to said forming the emitter electrode, a semiconductor region for use as an active-base region is formed in a surface region of the silicon substrate, the emitter electrode then being provided on the semiconductor region.

19. A manufacturing method according to claim 18, wherein a predetermined impurity is introduced into the semiconductor region through the emitter electrode so as to form an emitter region of the bipolar transistor.

20. A manufacturing method according to claim 1, wherein the anisotropic etching process used to remove the third insulating film is reactive ion etching.

21. A manufacturing method according to claim 1, wherein said silicon substrate includes at least one MISFET; whereby a semiconductor integrated circuit having a bipolar transistor and at least one MISFET can be formed.

22. A manufacturing method according to claim 21, wherein said at least one MISFET includes complementary MISFETs.

* * * * *